United States Patent
Bernstein et al.

(10) Patent No.: US 6,635,548 B2
(45) Date of Patent: Oct. 21, 2003

(54) CAPACITOR AND METHOD FOR FORMING SAME

(75) Inventors: Kerry Bernstein, Underhill, VT (US); Nicholas Theodore Schmidt, Colchester, VT (US); Anthony K. Stamper, Williston, VT (US); Stephen Arthur St. Onge, Colchester, VT (US); Steven Howard Voldman, South Burlington, VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/046,595

(22) Filed: Oct. 26, 2001

(65) Prior Publication Data

US 2002/0151150 A1 Oct. 17, 2002

Related U.S. Application Data

(62) Division of application No. 09/499,577, filed on Feb. 7, 2000, now Pat. No. 6,384,468.

(51) Int. Cl.[7] .............................................. H01L 21/20
(52) U.S. Cl. ....................... 438/387; 439/244; 439/253; 439/386
(58) Field of Search ................................ 438/243, 244, 438/386, 387, 253, 396

(56) References Cited

U.S. PATENT DOCUMENTS

| 4,481,283 A | 11/1984 | Kerr et al. |
|---|---|---|
| 4,954,927 A | 9/1990 | Park |
| 5,208,725 A | 5/1993 | Akcasu |
| 5,313,089 A | 5/1994 | Jones, Jr. |
| 5,339,212 A | 8/1994 | Geffken et al. |
| 5,406,447 A | 4/1995 | Miyazaki |
| 5,598,029 A | 1/1997 | Suzuki |
| 5,668,399 A | 9/1997 | Cronin et al. |
| 5,789,303 A | 8/1998 | Leung et al. |
| 5,851,870 A | 12/1998 | Alugbin et al. |
| 5,872,697 A | 2/1999 | Christensen et al. |
| 5,973,910 A * | 10/1999 | Gardner ...................... 361/313 |
| 6,251,740 B1 * | 6/2001 | Johnson et al. ............. 438/381 |
| 6,259,128 B1 | 7/2001 | Adler et al. |
| 6,291,848 B1 | 9/2001 | Chetlur et al. |
| 6,322,903 B1 * | 11/2001 | Siniaguine et al. ......... 428/617 |
| 6,323,099 B1 * | 11/2001 | Long et al. .................. 438/396 |
| 6,346,454 B1 * | 2/2002 | Sung et al. .................. 438/396 |
| 2001/0013660 A1 * | 8/2001 | Duncombe et al. ......... 257/760 |
| 2001/0021562 A1 * | 9/2001 | Lin ............................. 438/386 |
| 2001/0039087 A1 * | 11/2001 | Jammy et al. .............. 438/243 |
| 2002/0009849 A1 * | 1/2002 | Juengling ................... 438/253 |

OTHER PUBLICATIONS

D.B. Beach, S. Dhong, R.L. Franch, A. Grill, D.F. Heidel, K.A. Jenkins, M. Sheuermann and C. Smart, "High Dielectric Constant On–Chip Decoupling Capacitor Incorporated Into BEOL Fabrication Process," IBM Technical Disclosure Bulletin, vol. 37, No. 10, Oct. 1994, p. 413.

* cited by examiner

Primary Examiner—Kevin M. Picardat
(74) Attorney, Agent, or Firm—Richard M. Kotulak; Cantor Colburn LLP

(57) ABSTRACT

A method of forming an integrated circuit interconnect level capacitor is disclosed. In an exemplary embodiment, the method includes depositing a first insulator layer over an interconnect level surface of a semiconductor substrate having active devices. First and second conductive lines are formed in the first insulator layer, and the first insulator layer is etched to form a trench therein between the first and second conductive lines. A first conductive layer is deposited over the first and second conductive lines the said trench. A second insulator layer is deposited over the first conductive layer, and a second conductive layer is deposited over the second insulator layer. Then, a third conductive line is formed and disposed in the trench, the third conductive line overlying the second conductive barrier layer.

11 Claims, 5 Drawing Sheets

CAPACITOR AND METHOD FOR FORMING SAME

This application is a Divisional of U.S. Ser. No. 09/499,577 filed on Feb. 7, 2000 now U.S. Pat. No. 6,384,468.

FIELD OF THE INVENTION

The present invention relates to a capacitor and method for fabricating same, and, more particularly, relates to an interconnect level capacitor in an integrated circuit and method for fabricating same.

BACKGROUND OF THE INVENTION

Capacitors are used extensively in electronic devices for storing an electric charge. The capacitors essentially comprise two conductive plates separated by an insulator. The capacitance, or amount of charge held by the capacitor per applied voltage, is measured in farads and depends upon the area of the plates, the insulator thickness between them, and the dielectric constant of the insulator. Capacitors are used in filters, in analog-to-digital converters (ADCs), in memories, and in various control applications.

The integration of high value capacitors in integrated circuits is limited by the fact that conventional high value capacitors take up large areas of a chip and severely restrict interconnect routing in the region of the capacitor, thus reducing the device packing density and layout efficiency. Many applications, including telecommunications equipment, require a large number of capacitors, e.g., as coupling/decoupling capacitors and for filters.

Decoupling capacitors are used to decouple, or dampen, transient current spikes produced as a result of simultaneous switching of circuits on logic chips. Incorporating these decoupling capacitors as discrete off-chip components, substantially increases the bulk of the peripheral circuitry. Discrete decoupling capacitors are also very expensive. Another disadvantage is that as technology requires ever smaller components, such discrete capacitors must be miniaturized in order to fit in very small spaces. Fabrication of such small components is not always feasible.

Capacitors built into the integrated circuit chip eliminate the cost of discrete capacitor components. Capacitors built into integrated circuits are usually fabricated from polysilicon to polysilicon, metal to polysilicon, or metal to polycide structures. Providing decoupling capacitance in silicon by separate capacitor devices, takes up valuable silicon space. In dense chip areas, circuits are pushed apart to make room for the decoupling capacitors, resulting in longer interconnect lengths and reduced performance. Current metal-insulator-metal (MIM) capacitor structures comprise large area capacitors with limited capacitance per unit area. A further disadvantage is that such large area MIM capacitor structures consume excess chip space. In addition, present copper BEOL (back end of the line) technology cannot be used for large area capacitors due to CMP (chemical mechanical polishing) dishing process constraints.

U.S. Pat. No. 5,851,870 to Alugbin et al. provides a method for forming a capacitor for use in semiconductor integrated circuits, the capacitor including a metal-dielectric-metal stack formed within a window upon a conductive substrate. Alugbin et al. discloses contact to the top plate of the capacitor through a window within a window and contact to the bottom plate by a guard ring which contacts the conductive substrate. The method steps comprise forming a conductive substrate, forming a patterned dielectric upon the substrate, the patterned dielectric having an opening which exposes the substrate, the opening having at least one side, forming at least one conductive material within the opening, the conductive material contacting the substrate and not contacting the sides of the opening, forming a dielectric upon the conducting material, the dielectric not contacting the sides of the opening, and forming a conductive layer upon the dielectric layer, the conductive top layer not contacting the sides of the opening.

U.S. Pat. No. 5,789,303 to Leung et al. discloses a capacitor structure for an integrated circuit, comprising a bottom electrode, capacitor dielectric, and top electrode, formed on a passivation layer overlying the interconnect metallization. The capacitor electrodes are interconnected to the underlying integrated circuit from underneath, through conductive vias, to the underlying interconnect metallization.

U.S. Pat. No. 5,339,313 to Geffken et al. provides a decoupling capacitor, and method for forming same, which utilizes a plurality of tungsten studs and metal interconnects to maximize the surface area of the capacitor, thereby increasing the capacitance. The metal interconnects only partially overlap the tungsten studs, forming the first plate of the capacitor, so that the tops of the studs as well as the sides and tops of the interconnects provide the increased surface area. The capacitor may comprise two or more capacitors stacked one on the other to form relative upper and lower capacitors. There remains a need for an improved interconnect level decoupling capacitor in an integrated circuit and an improved method for fabricating same.

SUMMARY OF THE INVENTION

The above-discussed and other drawbacks and deficiencies of the prior art are overcome or alleviated by the present capacitor and method wherein a capacitor structure is built into the interconnect wiring level of a chip, eliminating the need for additional discrete capacitor components and their associated expense. The present capacitor structure increases capacitance by utilizing the top, bottom and sidewall surface areas of the capacitor structure, providing a decoupling capacitor within a trench etched into an insulator layer provided on the interconnect level of the chip, thus providing decoupling capacitance without sacrificing valuable silicon space. The present integrated circuit interconnect level capacitor structure comprises a first insulator layer overlying an interconnect level surface of an integrated circuit; first and second conductive lines provided in said first insulator layer and separated by a trench defined by said first insulator layer; a first conductive barrier layer overlying and connecting said first and second conductive lines; a second insulator layer overlying said first conductive barrier layer; a second conductive barrier layer overlying said second insulator layer; and a third conductive line disposed in said trench and overlying said second conductive barrier layer.

The present method employs damascene processing and use of a conductive barrier layer to enable fabrication of more densely packed capacitors, while also providing the advantages of minimal processing steps and compatibility with current semiconductor processes and materials. Particularly, the present process provides the advantage of BEOL processing which can be added as an option to existing integrated circuit fabrication processes without necessitating changes in sequence operations.

The present method comprises forming an integrated circuit interconnect level capacitor by depositing a first insulator layer over an interconnect level surface of a semiconductor substrate having active devices; forming first and second conductive lines in said first insulator layer; etching said first insulator layer to form a trench in said first insulator layer between said first and second conductive lines; depositing a first conductive barrier layer over said first and second conductive lines and said trench; depositing a second interlevel insulator layer over said first conductive barrier layer; depositing a second conductive barrier layer over said second interlevel insulator layer; forming a third conductive line disposed in said trench and overlying said second conductive barrier layer. It is preferred that said first and second conductive lines in said first insulator layer be parallel in order to achieve maximum capacitance and surface area.

BRIEF DESCRIPTION OF THE DRAWINGS

Referring now to the drawings wherein like elements are numbered alike in the several FIGURES.

DESCRIPTION OF THE PREFERRED EMBODIMENT

The present integrated circuit interconnect level capacitor comprises a first insulator layer overlying an interconnect level surface of an integrated circuit; first and second conductive lines provided in said first insulator layer and separated by a trench defined by said first insulator layer and by sidewalls of said first and second conductive lines; a first conductive barrier layer overlying and connecting said first and second conductive lines; a second insulator layer overlying said first conductive barrier layer; a second conductive barrier layer overlying said second insulator layer; and a third conductive line disposed in said trench and overlying said second conductive barrier layer.

The line layout may be patterned in grids or stripes, said first, second, and third conductive lines representing power rails, with the capacitor formed in said trench representing a decoupling capacitor. Thus, the present capacitor structure may be integrated into the power bus providing decoupling capacitance. A striped pattern is employed in the power bus alternating $V_{dd}$ and ground.

Figure 7:
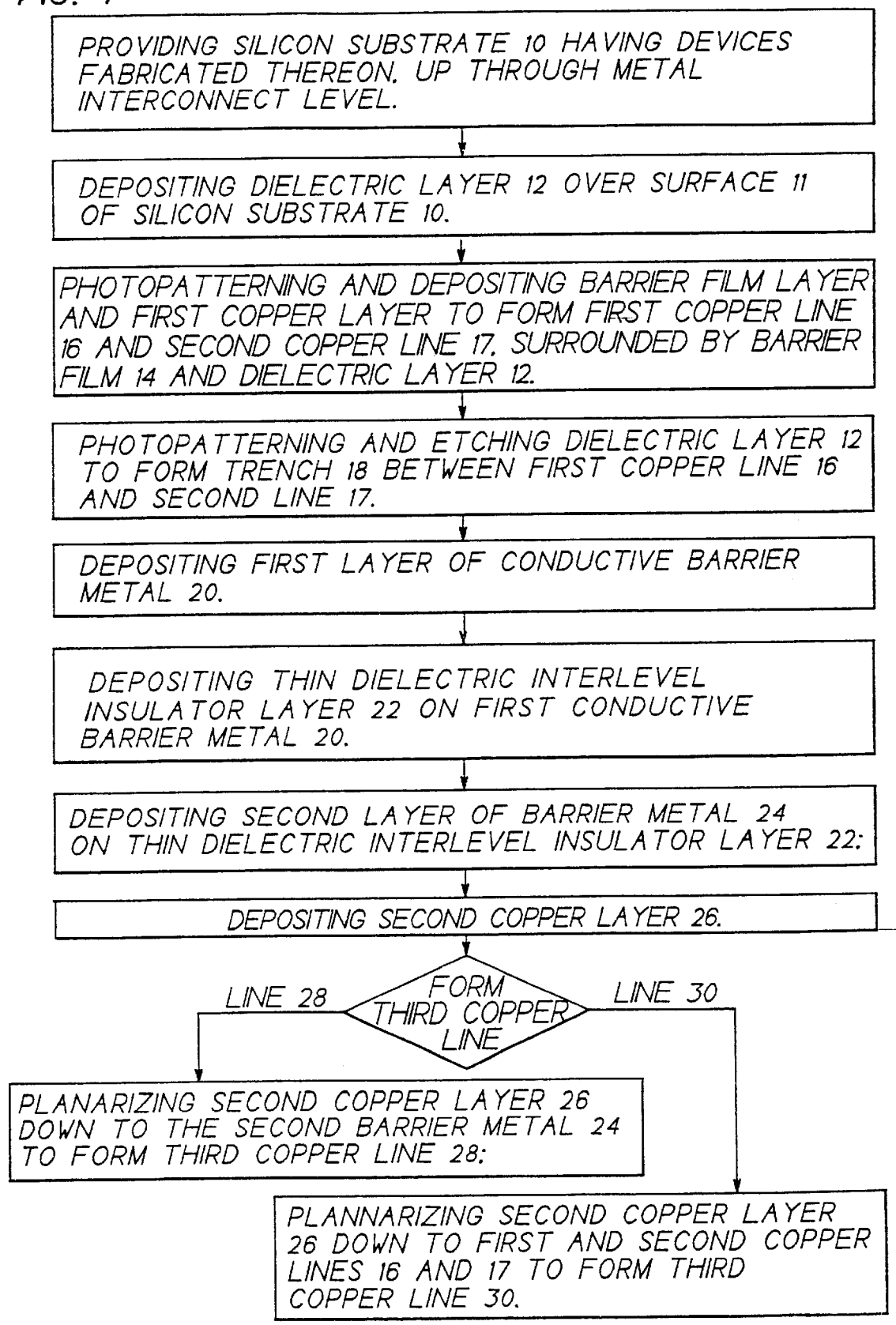
FIG. 7 is a process diagram showing process steps for two alternative embodiments of the present method.

Two embodiments of the present process for fabricating the present metal—metal capacitor will now be described in detail with reference to FIGS. 1 through 7. FIG. 7 provides a process diagram setting forth major steps in two alternate embodiments of the present fabrication process. FIGS. 1 through 6 provide cross-sectional views through the interconnect level of the integrated circuit at successive stages during fabrication of the present MIM capacitor structure.

While the present invention is described herein with particular respect to the embodiments shown in the Figures, variations thereof will readily occur to one of skill in the art, and such variations are within the scope of the present invention. In one such variation, the present capacitor structure may be formed as a hybrid capacitor wherein different metals are used, such as copper and aluminum. For example, metal interconnections may be formed of aluminum lines and copper may be deposited as the conductive barrier layers between the formed aluminum lines. It is also contemplated that one electrode (e.g., the first conductive barrier layer) may be formed of a first metal, such as aluminum, and the other electrode (e.g., the second conductive barrier layer) may be formed of a second metal, such as copper. Further, a plurality of structures may be fabricated in a grid or striped pattern.

Figure 1:
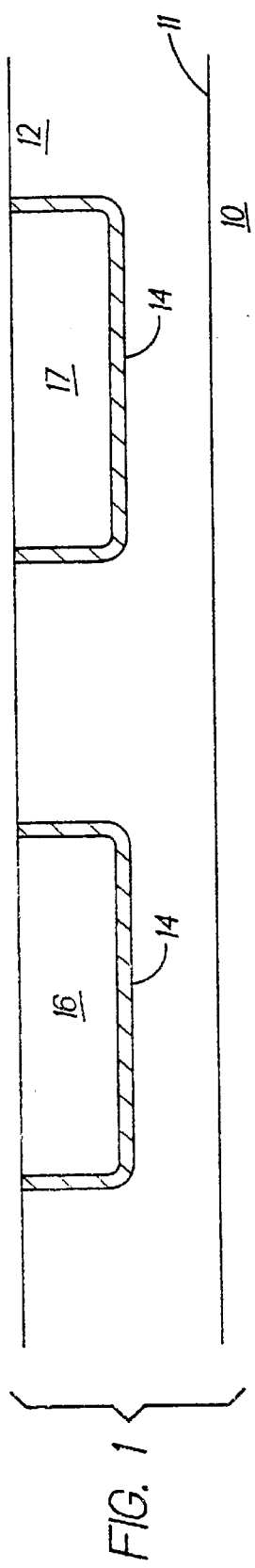
FIGS. 1–6 are cross-sectional diagrams illustrating various steps in the formation of alternate embodiments of the metal—metal capacitor of the present invention.

Turning now to the embodiment shown in FIG. 1, a metal interconnect level of a silicon substrate 10 having devices (not shown) fabricated thereon, is shown. While silicon is most often employed, the present capacitor structure and method may be used with any device-patterned semiconductor substrate, including, but not limited to, silicon, gallium arsenide, indium phosphide, and the like. Further, the silicon substrate may be p-type or n-type silicon.

Dielectric insulator layer 12 is deposited over surface 11 of patterned silicon substrate 10. The dielectric insulator layer may be any dielectric material suitable for insulating and protecting underlying devices, including, but not limited to, silicon dioxide, silicon nitride, or polyimide.

A barrier film and first copper layer are deposited and patterned to form barrier film 14 and copper interconnect lines 16 and 17 surrounded by dielectric interlevel insulator 12. As discussed above, interconnect lines 16 and 17 may comprise any suitable interconnect wiring material including, but not limited to, aluminum, copper, tungsten, gold, or combinations thereof. Further, interconnect lines 16 and 17 may each comprise the same material, or, alternatively, may each comprise a different material.

Figure 2:
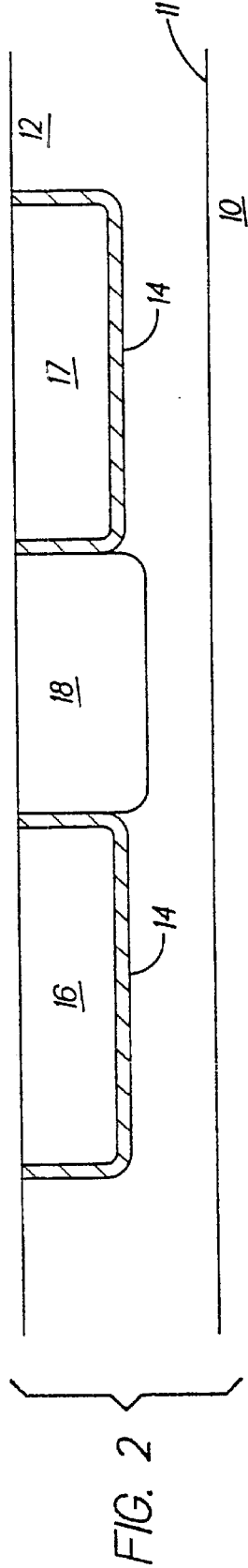

Barrier film 14 may be formed of any suitable conductive barrier material including, but not limited to, metal, such as tantalum. Barrier film 14 serves to prevent chemical interaction between interconnect lines 16 and 17 and dielectric interlevel insulator 12 (e.g., diffusion of copper through silicon dioxide.) The structure is photopatterned and dielectric interlevel insulator 12 is etched between copper lines 16 and 17 to form trench 18. FIG. 2 shows the stage of the present method after one mask has been used and etching accomplished to form trench 18. While reactive ion etch (RIE) is preferred, etching may be with any method sufficient to effect removal of dielectric interlevel insulator 12 in open areas so as to form trench 18, including, but not limited to, reactive ion etching, dry etching, plasma etching, wet chemical etching, or a combination thereof.

Figure 3:
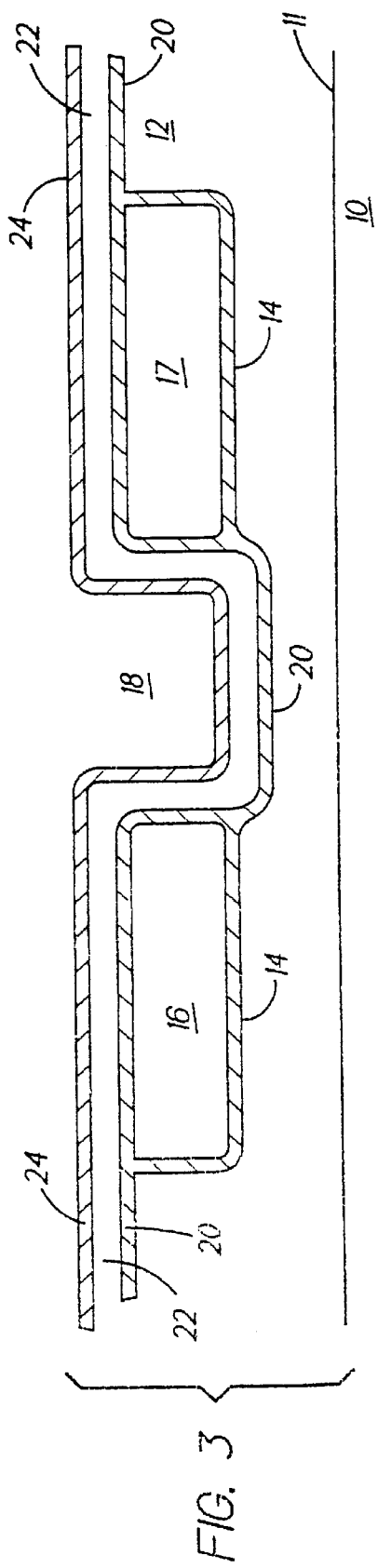

Turning to FIG. 3, first conductive barrier layer 20, thin dielectric interlevel insulator layer 22 and second conductive barrier layer 24 are deposited to a form metal-insulator-metal structure. First and second conductive barrier layers are deposited by some conformal deposition method including, but not limited to chemical vapor deposition or plasma enhanced chemical vapor deposition, so as to maintain the configuration of trench 18.

Interlevel insulator layer refers to an insulator layer that lies between two levels of metal or conductive material. Interlevel insulator layer 22 may be any suitable material including, but not limited to, silicon dioxide, silicon nitride, or polyimide.

Interlevel insulator layer 22 is also preferably deposited conformally, such as by chemical vapor deposition or plasma enhanced chemical vapor deposition, so as to maintain the configuration of trench 18.

Thin interlevel insulator layer 22 must be effective to provide reasonable capacitance in the resulting capacitor structure, while at the same time preventing shorting between the two capacitor plates. The thinner the interlevel insulator layer, the higher the capacitance. The thin interlevel insulator layer may be selected to maximize capacitance while also providing the desired reliability. A suitable interlevel insulator layer is silicon dioxide which has a dielectric constant of about 3.9. An interlevel insulator layer with a high dielectric constant is preferred, in order to maximize capacitance per unit area. A suitable thickness of an interlevel insulator layer comprising silicon dioxide is about 10 to about 2000 Angstroms, with about 100 to about 500 Angstroms preferred.

Figure 4:
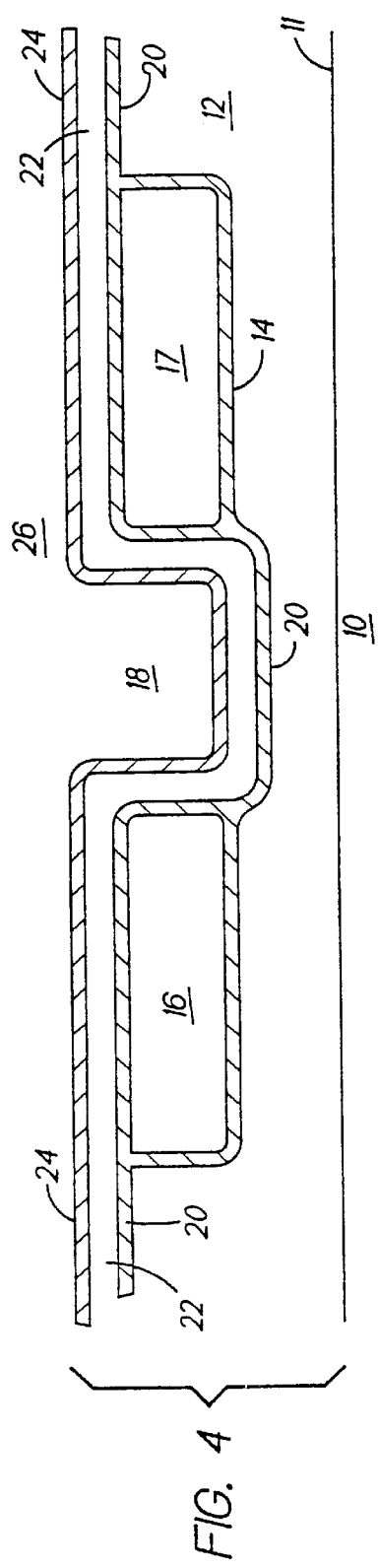

Second copper (interconnect) layer 26 is deposited over second barrier metal 24, as shown in FIG. 4. Second copper layer 26 is planarized to form a third copper line. Again, although the embodiment discussed uses second copper layer 26 to form a third interconnect line (line 28 shown in FIGS. 5 and 6, respectively), any suitable interconnect wiring material may be used for second interconnect layer 26 including, but not limited to, aluminum, copper, tungsten, gold, or combinations thereof. Further, second interconnect layer 26 may comprise the same material as interconnect lines 16 and 17, or, alternatively, may comprise a different material.

Figure 5:
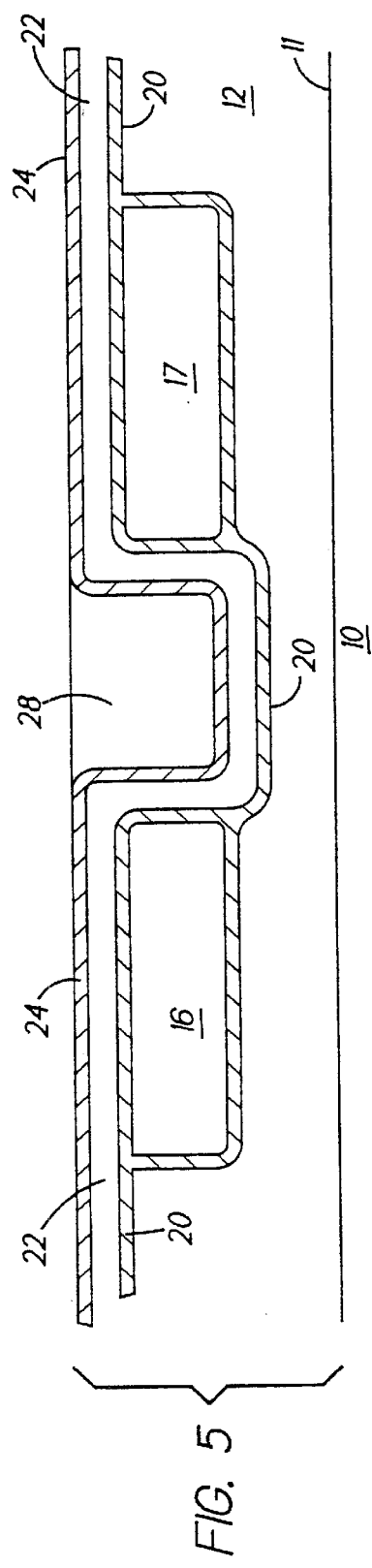
Figure 6:
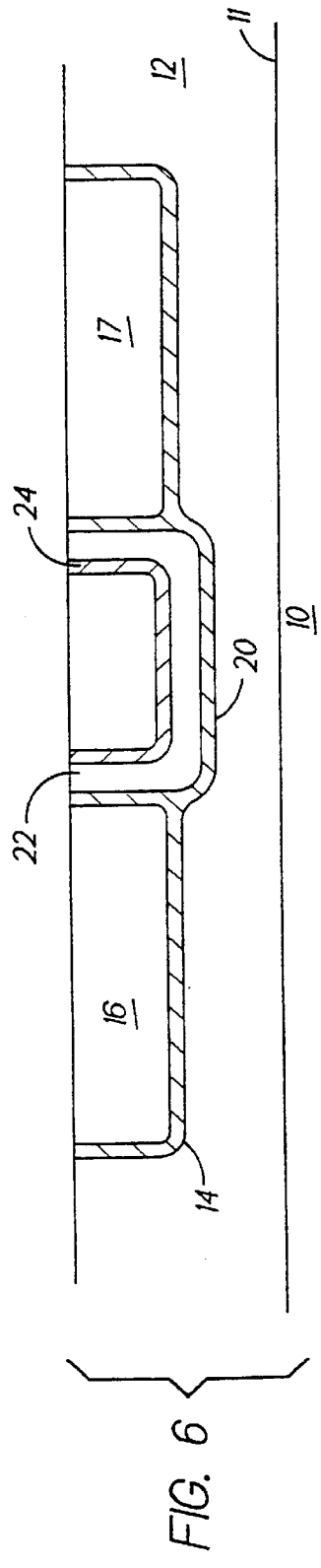

In one embodiment, second copper layer 26 is planarized down to the level of second barrier metal 24, to form third copper line 28, as shown in FIG. 5. One mask is required to cut conductive barrier layer 20 and 24 at the perimeter of the structure. In another embodiment, shown in FIG. 6, second copper layer 26 is planarized down to the level of first and second copper lines 16 and 17, to form third copper line 30.

Thus, the present method provides the advantage of fabrication simplicity, requiring a minimal number of processing steps, and using materials and equipment already used in integrated circuit fabrication. The present method utilizes one photomask and etch in creating trench 18, four depositions in laying down conductive barrier layers and third conductive line, and one planarizing step (e.g., chemical-mechanical polish). Further, the present method utilizes BEOL processing that does not require changes in the sequence steps for fabricating devices in the underlying silicon substrate.

Figure 8:
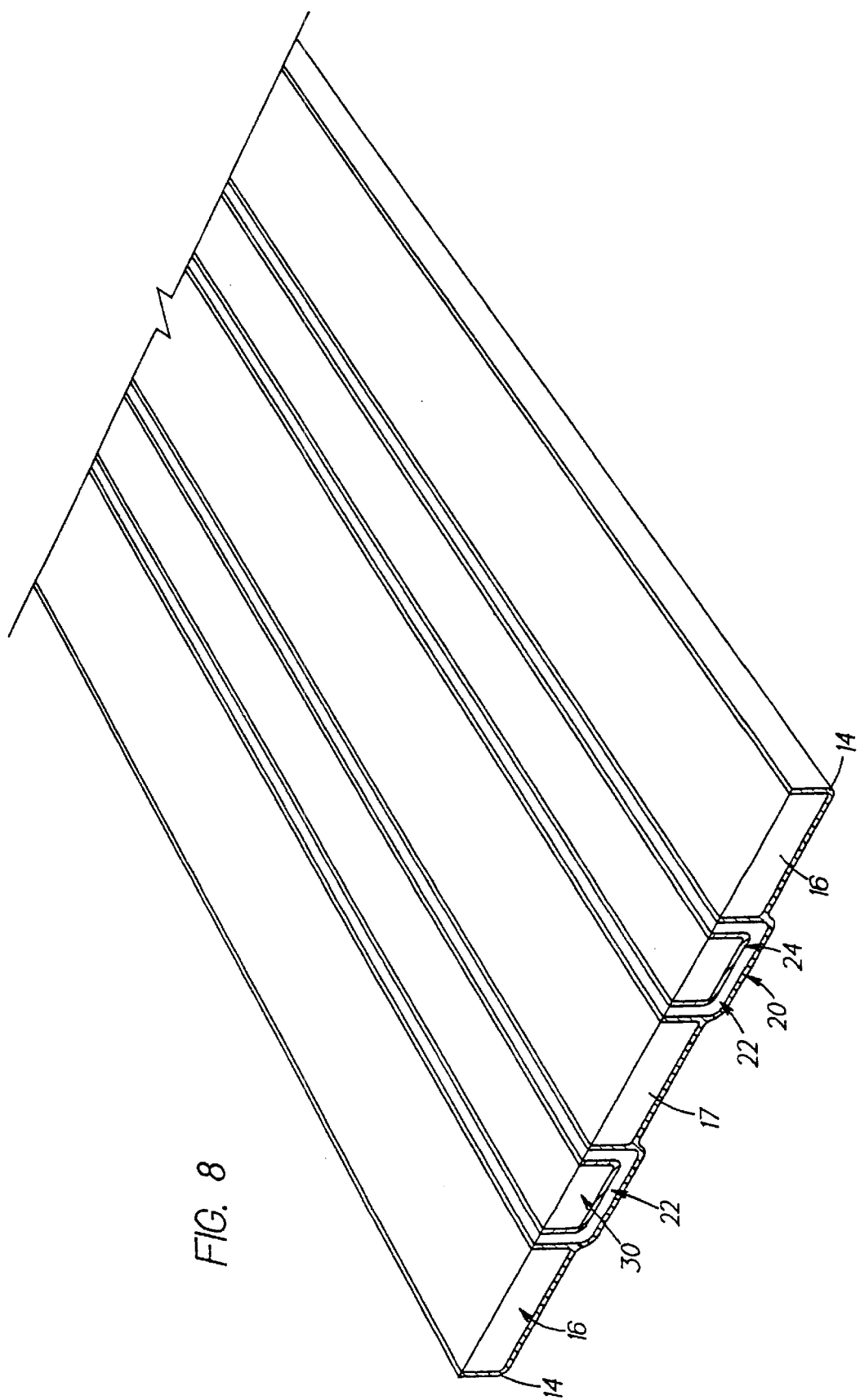
FIG. 8 is a perspective view of a capacitor of the present invention integrated into a power bus with a layout design forming a striped pattern.

The present capacitor structure is patterned in a grid or striped corrugated pattern to provide increased surface area and thus increased capacitance. As illustrated in FIG. 8, a striped pattern can be patterned wherein first and second conductive lines 16 and 17 serve as a ground bus and third conductive line 30 serves as a $V_{dd}$ supply bus. The stripes are integrated into the power bus alternating $V_{dd}$ and ground to provide decoupling capacitance. The present capacitor structure utilizes vertical and horizontal surfaces, formed of conductive barrier material layers, to increase top and bottom plate area and thus increase capacitance.

Figure 9:
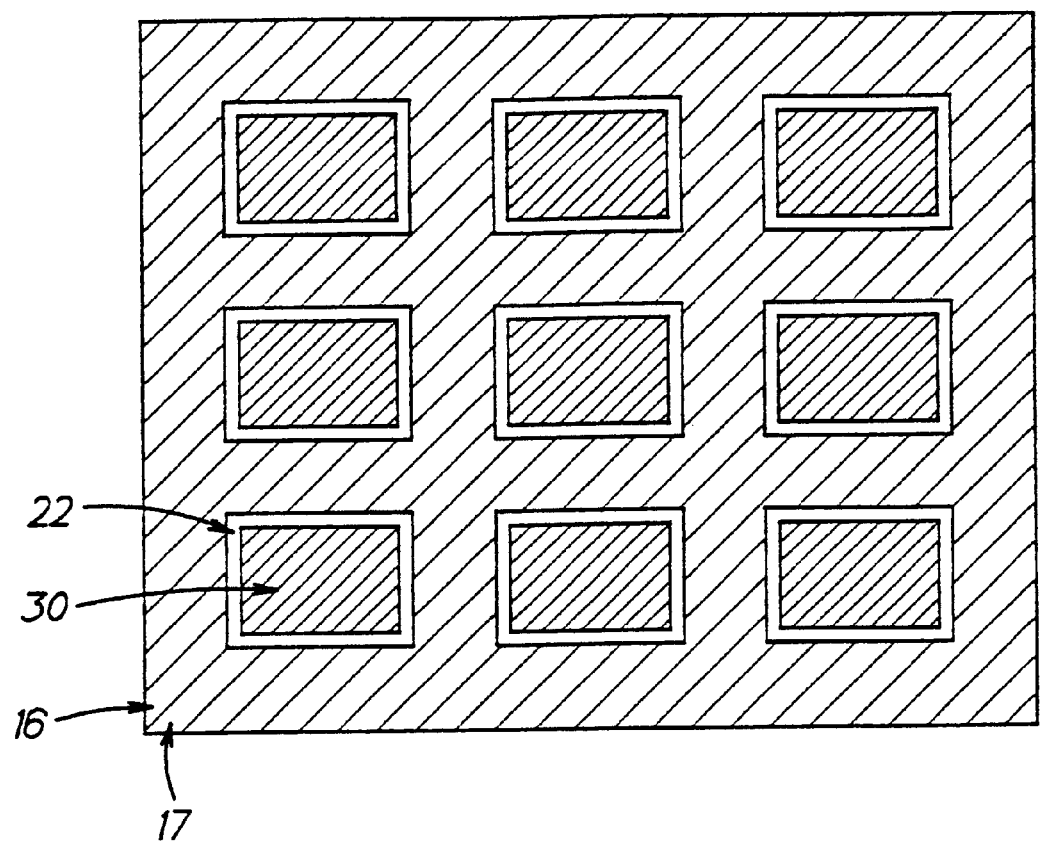
FIG. 9 is a top schematic view of a capacitor of the present invention with a layout design forming a grid pattern.

FIG. 9 depicts the present capacitor structure patterned in a grid pattern. First and second conductive lines 16 and 17 are interconnected to form a grid structure, with third conductive line 30 separated by insulator layer 22.

The present decoupling capacitor structure may advantageously be formed in selected regions for special signals, nets, and rails, and may be confined to specific interconnect levels. The present decoupling capacitor structure may also be used in dynamic domino circuits, which are extremely vulnerable to supply rail noise, for charge divider cascading. The present capacitor structure may be advantageously used in the peripheral circuit (I/O) region, where the local capacitance provides a means to discharge electrical overstress or electrostatic discharge current to assist in establishing a local low impedance shunt to power rails or ground planes. The copper interconnects of the present capacitor structure further assist in the electrical discharge interconnect critical current to failure ($I_{crit}$) due to the high melting temperature of the copper interconnect. Use of copper is preferred as a two hundred percent improvement in $I_{crit}$ for copper lines and a three hundred percent improvement in $I_{crit}$ for copper via structures has been demonstrated.

While preferred embodiments have been shown and described, various modifications and substitutions may be made thereto without departing from the spirit and scope of the invention. Accordingly, it is to be understood that the present invention has been described by way of illustrations and not limitation.

What is claimed is:

1. A method of forming an integrated circuit interconnect level capacitor comprising:

depositing a first insulator layer over an interconnect level surface of a semiconductor substrate having active devices;

forming first and second conductive lines in said first insulator layer;

etching said first insulator layer to form a trench in said first insulator layer between said first and second conductive lines;

depositing a first conductive barrier layer over said first and second conductive lines and said trench;

depositing a second insulator layer over said first conductive layer;

depositing a second conductive barrier layer over said second insulator layer;

forming a third conductive line disposed in said trench and overlying said second conductive barrier layer.

2. The method of claim 1, comprising forming parallel first and second conductive lines in said first insulator layer.

3. The method of claim 1, further comprising:

planarizing said third conductive line to expose said second conductive barrier layer.

4. The method of claim 1, further comprising:

planarizing said third conductive line to expose said first and second conductive lines.

5. The method of claim 3, wherein said planarizing comprises chemical mechanical polishing, reactive ion etching, plasma etching, wet chemical etching, or combinations thereof.

6. The method of claim 4, wherein said planarizing comprises chemical mechanical polishing, reactive ion etching, plasma etching, wet chemical etching, or combinations thereof.

7. The method of claim 1, further comprising:

disposing a barrier layer on bottom and vertical surfaces of said first and second conductive lines.

8. The method of claim 7, wherein said barrier layer comprises tantalum.

9. The method of claim 1, wherein said first, second and third conductive lines and said first and second conductive barrier layers each individually comprise metal, copper, aluminum, tungsten, gold, or combinations thereof.

10. The method of claim 1, wherein said first, second and third conductive lines each comprise copper.

11. The method of claim 1, wherein said first and second insulator layers comprise silicon nitride, silicon dioxide, polyimide, or combinations thereof.

* * * * *